US011094850B2

(12) United States Patent
Lim et al.

(10) Patent No.: US 11,094,850 B2
(45) Date of Patent: Aug. 17, 2021

(54) LIGHT EMITTING DEVICE AND LIGHTING APPARATUS HAVING ENHANCED OPTICAL AND ELECTRICAL CHARACTERISTICS BY DIFFUSION BARRIER LAYER

(71) Applicant: SUZHOU LEKIN SEMICONDUCTOR CO., LTD., Taicang (CN)

(72) Inventors: Woo Sik Lim, Seoul (KR); Jae Won Seo, Seoul (KR)

(73) Assignee: SUZHOU LEKIN SEMICONDUCTOR CO., LTD., Taicang (CN)

(*) Notice: Subject to any disclaimer, the term of this patent is extended or adjusted under 35 U.S.C. 154(b) by 0 days.

(21) Appl. No.: 16/515,450

(22) Filed: Jul. 18, 2019

(65) Prior Publication Data
US 2019/0341529 A1 Nov. 7, 2019

Related U.S. Application Data

(63) Continuation of application No. 16/363,178, filed on Mar. 25, 2019, now Pat. No. 10,411,166, which is a
(Continued)

(30) Foreign Application Priority Data

Jun. 11, 2014 (KR) .................. 10-2014-0070924

(51) Int. Cl.
H01L 33/46 (2010.01)
H01L 33/40 (2010.01)
(Continued)

(52) U.S. Cl.
CPC ............ H01L 33/46 (2013.01); H01L 33/382 (2013.01); H01L 33/405 (2013.01); H01L 33/44 (2013.01);
(Continued)

(58) Field of Classification Search
None
See application file for complete search history.

(56) References Cited

U.S. PATENT DOCUMENTS 7,095,061 B2  8/2006  Steigerwald et al.
8,368,100 B2  2/2013  Donofrio et al.
(Continued)

FOREIGN PATENT DOCUMENTS

CN  101494268 A  7/2009
CN  101867002 A  10/2010
(Continued)

OTHER PUBLICATIONS

U.S. Appl. No. 16/363,178, filed Mar. 25, 2019.
U.S. Appl. No. 16/215,238, filed Dec. 10, 2018.
U.S. Appl. No. 15/315,938, filed Dec. 2, 2016.

Primary Examiner — Bilkis Jahan
(74) Attorney, Agent, or Firm — Birch, Stewart, Kolasch & Birch, LLP

(57) ABSTRACT

A light emitting device includes a substrate; a light emitting structure disposed on the substrate; a first insulation layer disposed on the light emitting structure; a second insulation layer disposed on the first insulation layer; a first electrode and a second electrode electrically connected to the light emitting structure; a first pad electrically connected to the first electrode; and a second pad electrically connected to the second electrode.

15 Claims, 6 Drawing Sheets

Related U.S. Application Data continuation of application No. 16/215,238, filed on Dec. 10, 2018, now Pat. No. 10,333,031, which is a continuation of application No. 15/315,938, filed as application No. PCT/KR2015/005265 on May 26, 2015, now Pat. No. 10,186,639.

(51) Int. Cl.
*H01L 33/44* (2010.01)
*H01L 33/38* (2010.01)
*H01L 33/48* (2010.01)
*H01L 33/62* (2010.01)

(52) U.S. Cl.
CPC ............ H01L 33/486 (2013.01); H01L 33/62 (2013.01); *H01L 33/483* (2013.01); *H01L 2224/16145* (2013.01); *H01L 2224/48091* (2013.01)

(56) References Cited

U.S. PATENT DOCUMENTS

| | | | |
|---|---|---|---|
| 8,476,644 B2 | 7/2013 | Illek et al. | |
| 9,293,664 B2 | 3/2016 | Seo et al. | |
| 9,620,679 B2 | 4/2017 | Chen et al. | |
| 2006/0281203 A1 | 12/2006 | Epler et al. | |
| 2009/0283787 A1* | 11/2009 | Donofrio | H01L 33/486 |
| | | | 257/98 |
| 2012/0074441 A1* | 3/2012 | Seo | H01L 33/0095 |
| | | | 257/91 |
| 2012/0138969 A1* | 6/2012 | Moon | H01L 33/405 |
| | | | 257/88 |
| 2012/0305967 A1* | 12/2012 | Yeh | H01L 33/382 |
| | | | 257/98 |
| 2014/0077221 A1 | 3/2014 | Genei et al. | |

FOREIGN PATENT DOCUMENTS

| | | |
|---|---|---|
| CN | 102354723 A | 2/2012 |
| CN | 102460744 A | 5/2012 |
| CN | 103117347 A | 5/2013 |
| CN | 103119735 A | 5/2013 |
| EP | 2302708 A2 | 3/2011 |
| EP | 2 782 147 A1 | 9/2014 |
| JP | 2008-288548 A | 11/2008 |
| KR | 10-2012-0031342 A | 4/2012 |
| KR | 10-2012-0031343 A | 4/2012 |
| KR | 10-2012-0069616 A | 6/2012 |
| KR | 10-2012-0134020 A | 12/2012 |
| KR | 10-2014-0006429 A | 1/2014 |
| KR | 10-1403639 B1 | 6/2014 |
| WO | 2014/048988 A1 | 4/2014 |

\* cited by examiner

[Fig. 3]
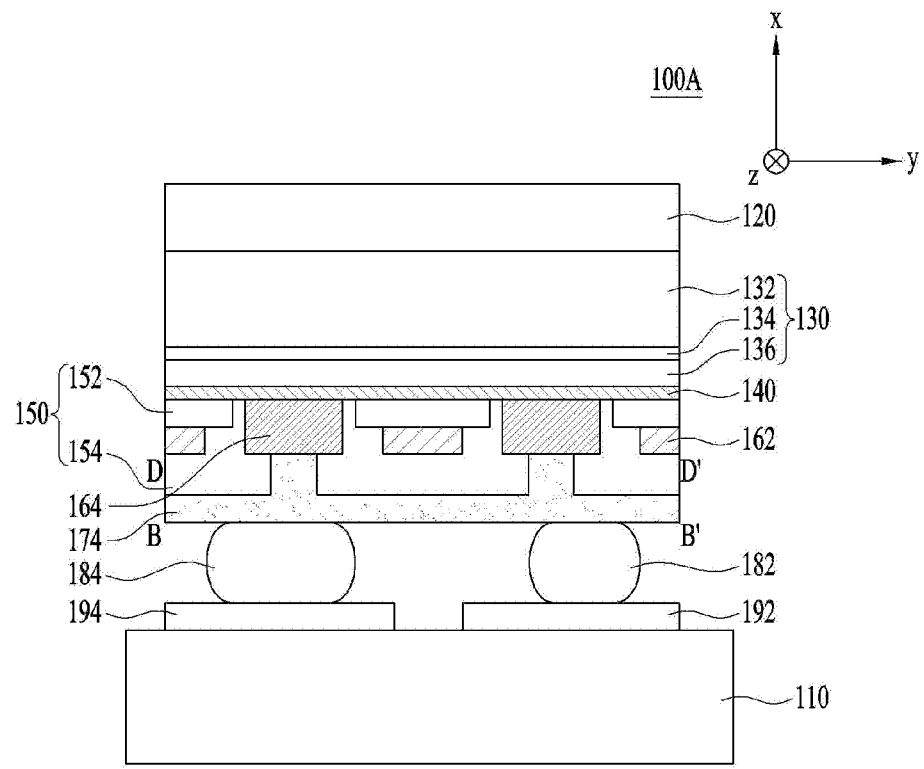
[Fig. 4]
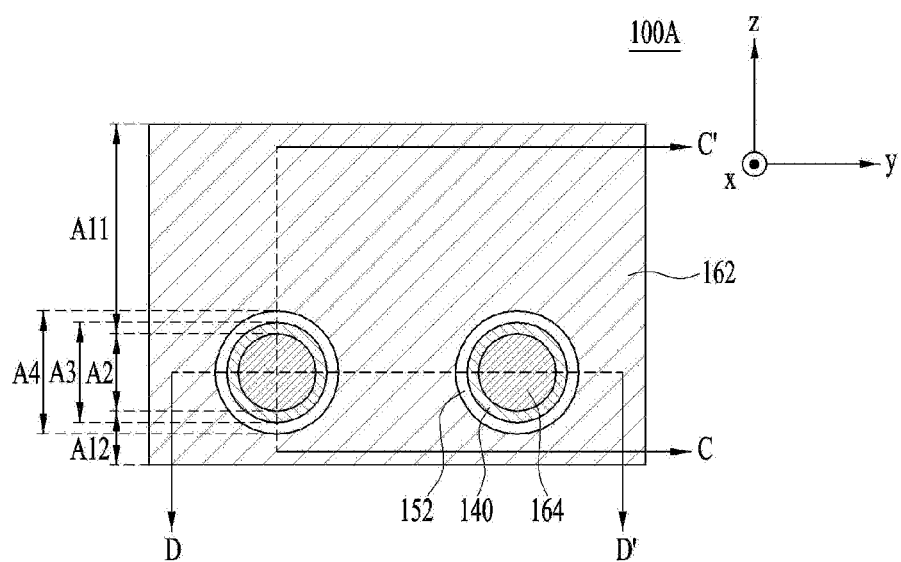

[Fig. 5]
[Fig. 6]
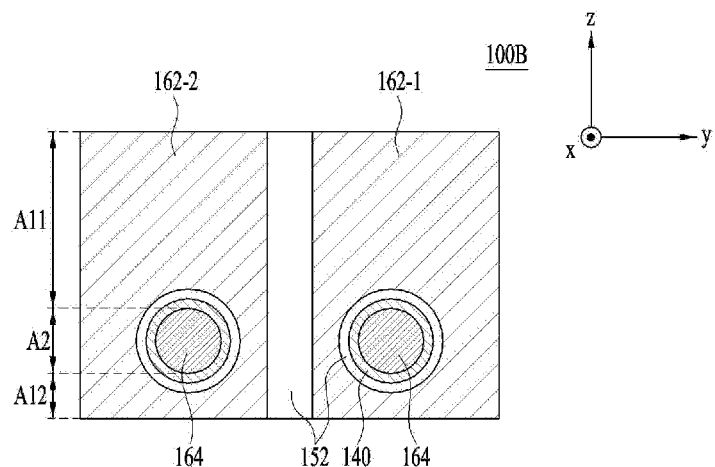
[Fig. 7a]
[Fig. 7b]
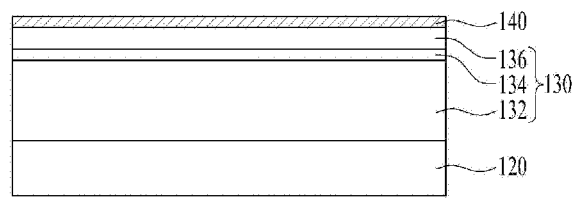

[Fig. 8b]
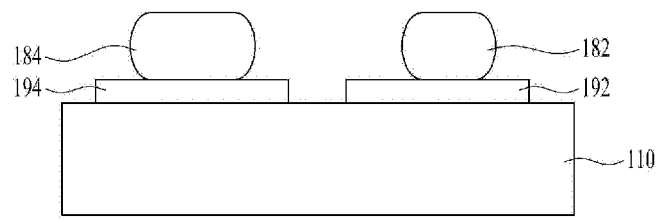
[Fig. 9]
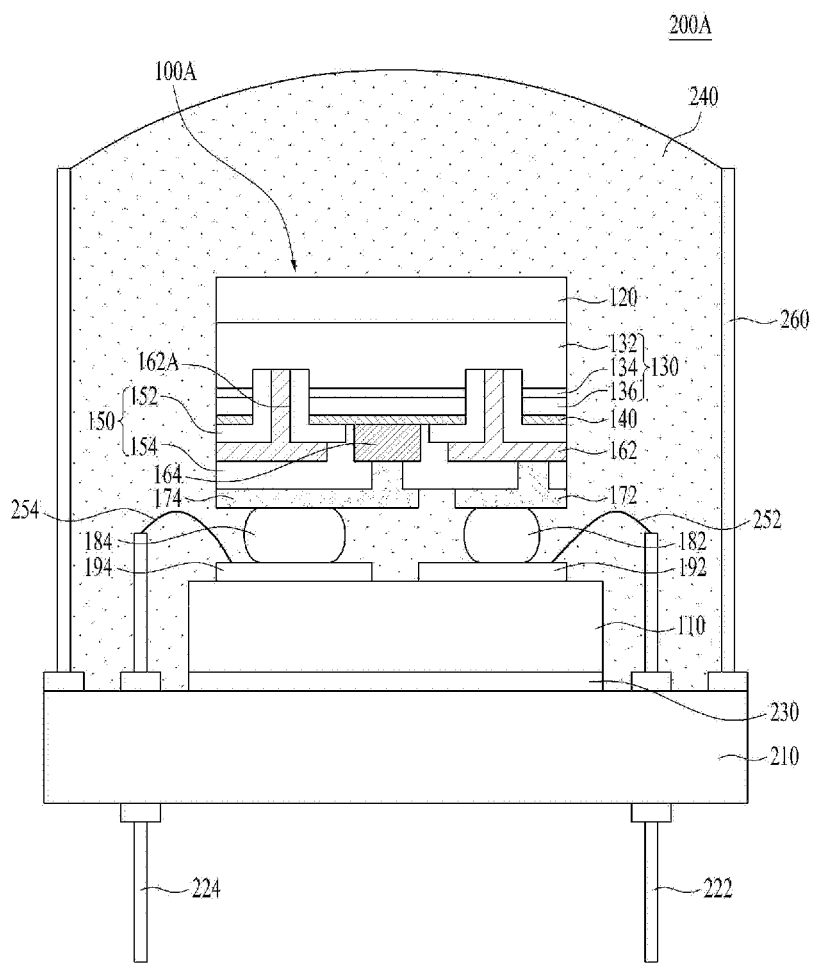

LIGHT EMITTING DEVICE AND LIGHTING APPARATUS HAVING ENHANCED OPTICAL AND ELECTRICAL CHARACTERISTICS BY DIFFUSION BARRIER LAYER

CROSS-REFERENCE TO RELATED APPLICATIONS

This Application is a Continuation of U.S. patent application Ser. No. 16/363,178 filed on Mar. 25, 2019 (now U.S. Pat. No. 10,411,166 issued on Sep. 10, 2019), which is a Continuation of U.S. patent application Ser. No. 16/215,238 filed on Dec. 10, 2018 (now U.S. Pat. No. 10,333,031 issued on Jun. 25, 2019), which is a Continuation of U.S. patent application Ser. No. 15/315,938 filed on Dec. 2, 2016 (now U.S. Pat. No. 10,186,639 issued on Jan. 22, 2019), which is the National Phase of PCT International Application No. PCT/KR2015/005265 filed on May 26, 2015, which claims the priority benefit under 35 U.S.C. § 119(a) to Korean Patent Application No. 10-2014-0070924 filed in the Republic of Korea on Jun. 11, 2014, all of which are hereby expressly incorporated by reference into the present application.

BACKGROUND OF THE INVENTION

Field of the Invention

Embodiments relate to a light emitting device and a lighting apparatus.

Discussion of the Related Art

Light emitting diodes (LEDs) are a kind of semiconductor device that is used as a light source or used to transmit or receive a signal by converting electricity into infrared light or other light, using characteristics of compound semiconductors.

Group III-V nitride semiconductors are being considered as core materials for light emitting devices such as LEDs and laser diodes (LDs), by virtue of physical and chemical characteristics thereof.

LEDs do not contain any environmental pollution material such as mercury (Hg) used in existing lighting devices such as incandescent lamps or fluorescent lamps and, as such, have an advantage of being environmentally friendly. In addition, LEDs have advantages of long lifespan and low power consumption. In this regard, such LEDs are being substituted for existing light sources.

Research is being conducted to achieve an enhancement in optical and electrical characteristics of light emitting devices and light emitting device packages.

SUMMARY OF THE INVENTION

Embodiments provide a light emitting device and a lighting apparatus, which have enhanced optical and electrical characteristics.

In an embodiment, there is provided a light emitting device including a substrate, a light emitting structure comprising a first conductivity type semiconductor layer, an active layer, and a second conductivity type semiconductor layer disposed on the substrate, a reflective layer disposed on the light emitting structure, the reflective layer having first and second areas neighboring each other in a horizontal direction, a first electrode disposed to extend to the first conductivity type semiconductor layer with passing through the second conductivity type semiconductor layer and the active layer at at least a portion of the first area of the reflective layer, a first insulating layer interposed between the first electrode and a side surface of the light emitting structure and between the first electrode and the reflective layer, a diffusion barrier layer disposed at the second area of the reflective layer, a second insulating layer disposed on the first electrode and the diffusion barrier layer, and first and second bonding layers respectively connected to the first electrode and the diffusion barrier layer with passing through the second insulating layer.

The diffusion barrier layer and the first insulating layer may be disposed on the reflective layer while being spaced apart from each other in a direction perpendicular to a thickness direction of the light emitting structure.

The diffusion barrier layer and the first electrode may be disposed to be spaced apart from each other in a direction perpendicular to a thickness direction of the light emitting structure.

The light emitting device may further include a sub-mount, and first and second metal pads disposed on the sub-mount while being spaced apart from each other in a horizontal direction. The first and second conductivity type semiconductor layers may be connected to the first and second metal pads, respectively. The light emitting device may further include a first bump interposed between the first bonding layer and the first metal pad, and a second bump interposed between the second bonding layer and the second metal pad.

The first insulating layer and the second insulating layer may be made of different materials, respectively. The first insulating layer and the second insulating layer may be made of the same material.

The diffusion barrier layer may have a first thickness of 50 nm to several nm in a thickness direction of the light emitting structure.

The diffusion barrier layer may have a first width at a portion thereof contacting the reflective layer at the second area such that the first width is equal to or greater than a second width of a portion of the second bonding layer passing through the second insulating layer.

The diffusion barrier layer and the first electrode may be made of the same material. The diffusion barrier layer and the first electrode may be made of different materials, respectively.

The diffusion barrier layer may have a first thickness in a thickness direction of the light emitting structure such that the first thickness is greater than a second thickness of the first electrode.

The diffusion barrier layer may include at least one of Ni, Ti, Pt, or W.

The light emitting device may further include a second electrode electrically connected to the second conductivity type semiconductor layer. The diffusion barrier layer and the second electrode may form an integrated structure.

The diffusion barrier layer may have a circular, oval or polygonal planar shape.

The diffusion barrier layer and the first insulating layer may have the same planar shape. The diffusion barrier layer and the first insulating layer may have different planar shapes, respectively.

In another embodiment, there is provided a light emitting device including a substrate, a light emitting structure comprising a first conductivity type semiconductor layer, an active layer, and a second conductivity type semiconductor layer disposed on the substrate, a reflective layer disposed on the light emitting structure, first and second bonding layers disposed on the reflective layer, a diffusion barrier layer locally interposed between the reflective layer and the second bonding layer, a first electrode disposed to extend to the first conductivity type semiconductor layer with passing through the reflective layer, the second conductivity type semiconductor layer and the active layer, a first insulating layer interposed between the first electrode and a side surface of the light emitting structure and between the first electrode and the reflective layer, and a second insulating layer disposed on the first electrode and the diffusion barrier layer, wherein the first and second bonding layers are connected to the first electrode and the diffusion barrier layer, respectively, with passing through the second insulating layer.

In another embodiment, there is provided a lighting apparatus including the light emitting device.

In the light emitting device and lighting apparatus according to each embodiment, the diffusion barrier layer is interposed between the reflective layer and each bonding layer, to prevent diffusion of the constituent atoms of the bonding layer into the reflective layer or epitaxial layer, and, as such, it may be possible to avoid problems such as degradation of reflectance, degradation of electrical characteristics and degradation of light emission efficiency. In addition, the diffusion barrier layer is locally disposed on the reflective layer and, as such, peeling-off thereof may be prevented or minimized. Thus, high reliability is secured.

BRIEF DESCRIPTION OF THE DRAWINGS

FIG. 3 is a cross-sectional view taken along line B-B' of FIG. 1.

FIG. 4 illustrates a plan view of the light emitting device of the embodiment illustrated in FIGS. 1 and 2 under the condition that a lower structure, a second insulating layer, and first and second bonding layers are removed from the light emitting device.

FIG. 5 is a sectional view explaining characteristics of the light emitting device illustrated in FIGS. 1 and 4.

FIG. 6 illustrates a plan view of a light emitting device according to another embodiment corresponding to of the embodiment illustrated in FIGS. 1 and 2, from which the lower structure and the first and second bonding layers are removed.

FIGS. 7a to 7h are sectional views explaining respective processes of a method for manufacturing an upper structure in the light emitting device illustrated in FIG. 2.

FIGS. 8a and 8b are sectional views explaining processes of a method for manufacturing the lower structure in the light emitting device illustrated in FIG. 2.

FIG. 9 illustrates a sectional view of a light emitting device package according to an embodiment.

DETAILED DESCRIPTION OF THE EMBODIMENTS

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art.

It will be understood that when an element is referred to as being "on" or "under" another element, it can be directly on or under another element or can be indirectly formed such that an intervening element is also present.

When an element is referred to as being "on" or "under", "under the element" as well as "on the element" can be included based on the element.

Relative terms such as "first", "second", "on/above/upper", and "under/below/lower" may be used herein solely to distinguish one entity or element from another entity or element without necessarily requiring or implying any physical or logical relationship or order between such entities or elements.

Hereinafter, light emitting devices according to embodiments will be described with reference to the accompanying drawings. The light emitting devices will be described in conjunction with the case in which the light emitting devices are of a flip bonding type, for best understanding thereof, but embodiments are not limited thereto. For convenience of description, light emitting devices 100A and 100B will be described using a Cartesian coordinate system (x, y, z) in each drawing, but embodiments may be described using other coordinate systems.

Figure 1:
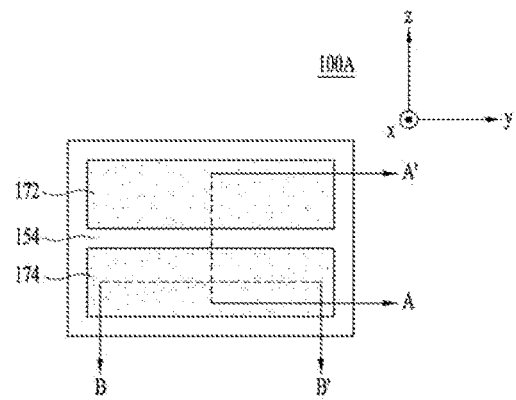
FIG. 1 illustrates a plan view of a light emitting device according to an embodiment.
Figure 2:
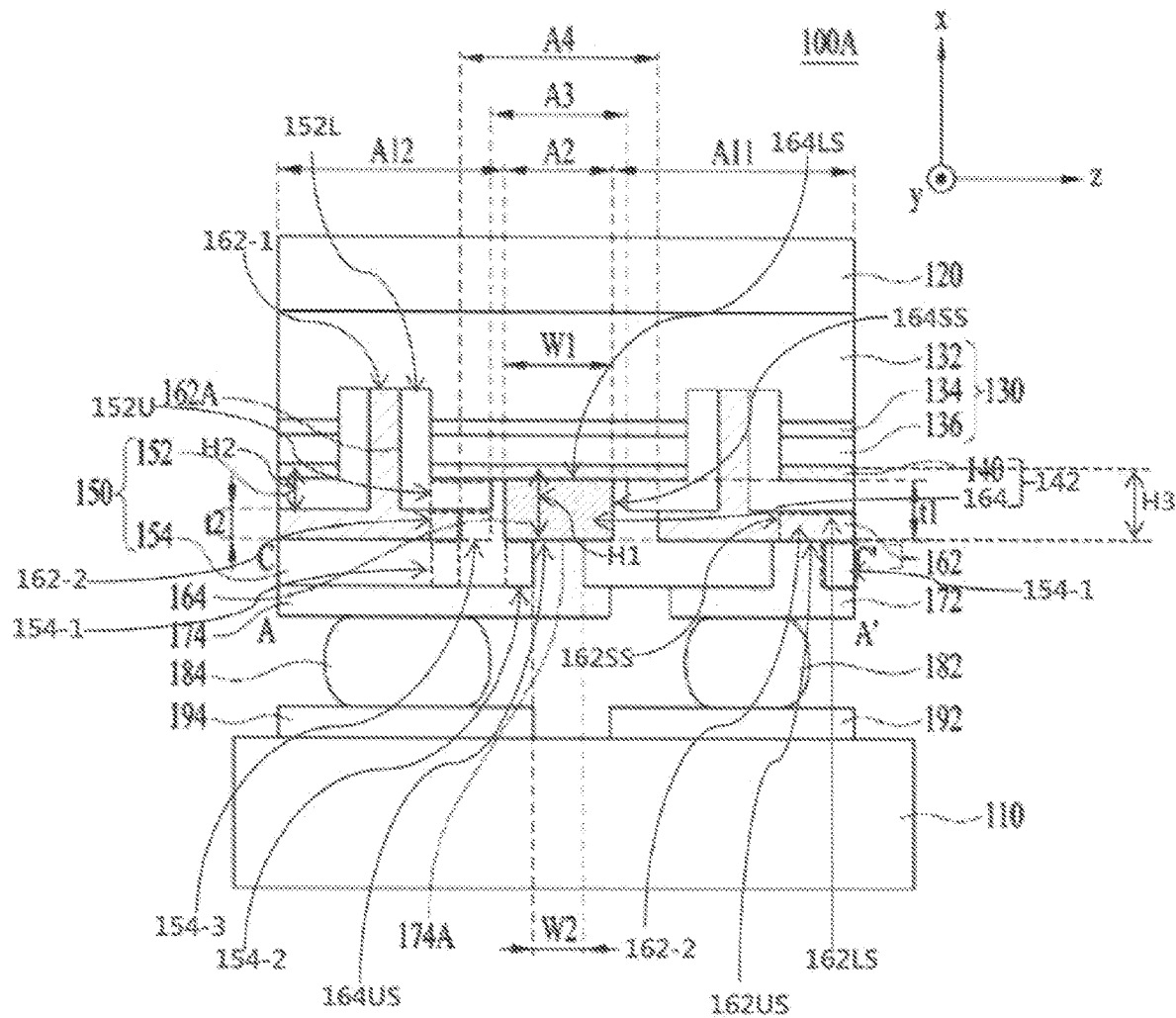
FIG. 2 is a cross-sectional view taken along line A-A' of FIG. 1.

FIG. 1 illustrates a plan view of a light emitting device 100 according to an embodiment. FIG. 2 is a cross-sectional view taken along line A-A' of FIG. 1. FIG. 3 is a cross-sectional view taken along line B-B' of FIG. 1.

The light emitting device 100A may include a light emitting diode (LED). The LED may be a color LED to emit blue, green or red light, an ultraviolet (UV) LED, a deep UV LED or a non-polar LED. Light emission of such an LED may be implemented using various semiconductors, but embodiments are not limited thereto.

Referring to FIGS. 1 to 3, the light emitting device 100A according to the embodiment may include a sub-mount 110, a substrate 120, a light emitting structure 130, a reflective layer 140, an insulating layer 150, a first electrode 162, a diffusion barrier layer (or capping layer) 164, first and second bonding layers (or chip bonding layers or pads) 172 and 174, first and second bumps 182 and 184, and first and second metal pads 192 and 194.

Hereinafter, the substrate 120, light emitting structure 130, reflective layer 140, insulating layer 150, first electrode 162, diffusion barrier layer (or second electrode) 164, and first and second bonding layers 172 and 174 will be referred to as an "upper structure", and the sub-mount 110, first and second bumps 182 and 184, and first and second metal pads 192 and 194 will be referred to as a "lower structure". From FIG. 1, illustration of the lower structure including the element 110 and the elements 182 to 194 is omitted.

First, the upper structure including the elements 120 to 174 will be described.

The light emitting device 100A illustrated in FIGS. 2 and 3 may include the upper structure including the elements 120 to 174 and the lower structure including the element 110 and the elements 182 to 194.

Figure 7C:
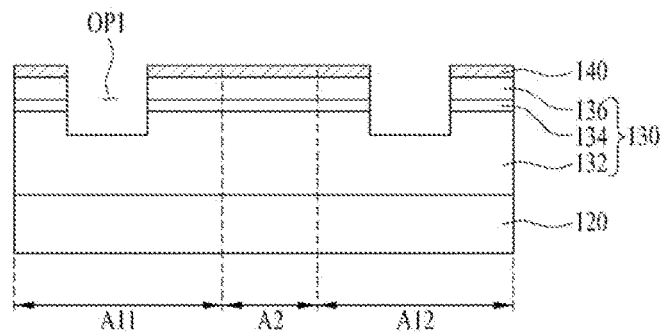
Figure 7D:
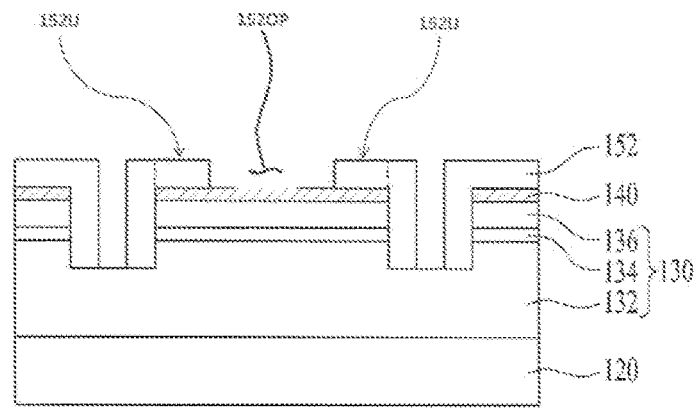
Figure 7E:
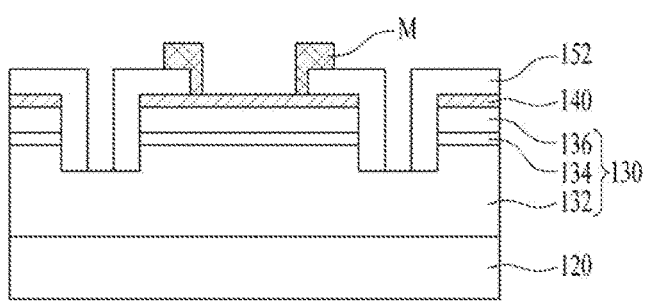
Figure 7F:
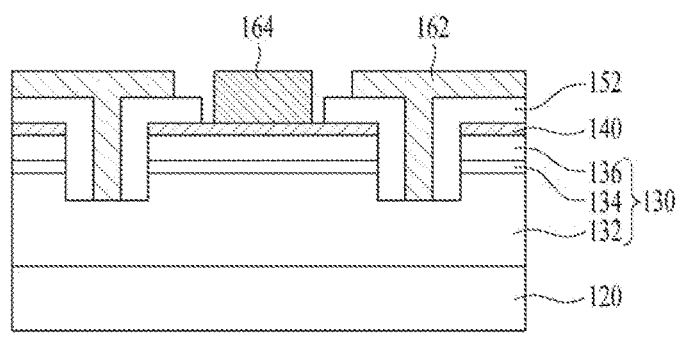
Figure 7G:
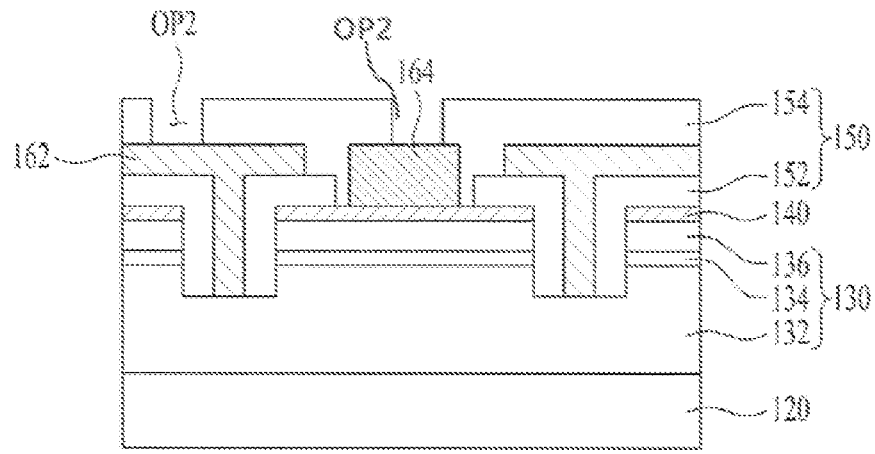
Figure 7H:
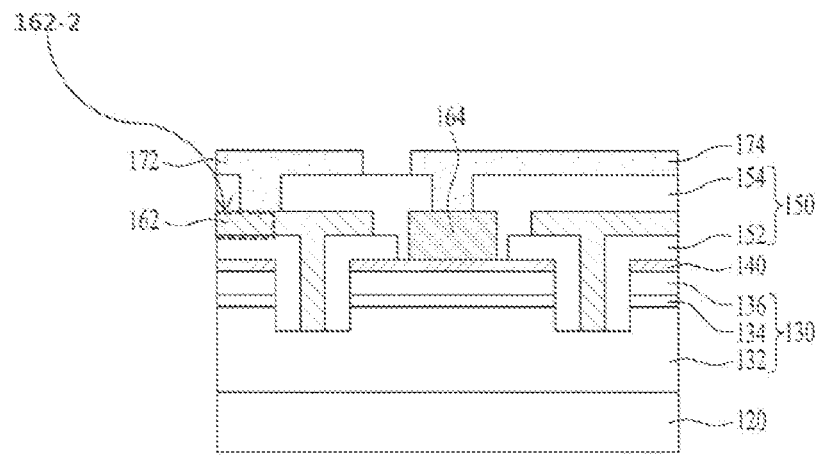

For convenience of description, the upper structure including the elements 120 to 174 will be described in conjunction with the case in which the elements 130 to 174 of the upper structure are disposed on the substrate 120, as illustrated in FIG. 7h, in place of the case in which the elements 130 to 174 of the upper structure are disposed beneath the substrate 120, as illustrated in FIGS. 2 and 3.

The substrate 120 may have light transmissivity and, as such, light emerging from an active layer 134 may be emitted through the substrate 120. For example, the substrate 120 may be made of at least one of sapphire ($Al_2O_3$), SiC, GaAs, GaN, ZnO, Si, GaP, InP, or Ge, but the embodiment is not limited thereto. The substrate 120 may have mechanical strength allowing the substrate 120 to be easily separated into separate chips through a scribing process or a breaking process while preventing the entire nitride semiconductor from being bent.

A buffer layer (not shown) may be formed between the substrate 120 and the light emitting structure 130, to perform a function of improving lattice match between the substrate 120 and the light emitting structure 130. For example, the buffer layer may include AlN or undoped nitride, but the embodiment is not limited thereto. The buffer layer may be dispensed with in accordance with the kind of the substrate 120 and the kind of the light emitting structure 130.

The light emitting structure 130 may be disposed on the substrate 120. The light emitting structure 130 may include a first conductivity type semiconductor layer 132, an active layer 134, and a second conductivity type semiconductor layer 136.

The first conductivity type semiconductor layer 132 may be interposed between the substrate 120 and the active layer 134, and may be made of a semiconductor compound. In particular, the first conductivity type semiconductor layer 132 may be made of a Group III-V or Group II-VI compound semiconductor. The first conductivity type semiconductor layer 132 may be doped with a first conductivity type dopant. For example, the first conductivity type semiconductor layer 132 may include a semiconductor material having a formula of $Al_xIn_yGa_{1-x-y}N$ ($0 \le x \le 1$, $0 \le y \le 1$, and $0 \le x+y \le 1$). The first conductivity type semiconductor layer 132 may be made of at least one of InAlGaN, AlGaAs, GaP, GaAs, GaAsP, or AlGaInP. When the first conductivity type semiconductor layer 132 is an n-type semiconductor layer, the first conductivity type dopant is an n-type dopant such as Si, Ge, Sn, Se, or Te. The first conductivity type semiconductor layer 132 may be formed to have a single layer structure or a multilayer structure, but the embodiment is not limited thereto.

The active layer 134 may be interposed between on the first conductivity type semiconductor layer 132 and the second conductivity type semiconductor layer 136. The active layer 134 may include one of a single well structure, a multi-well structure, a single quantum well structure, a multi-quantum well (MQW) structure, a quantum dot structure, or a quantum wire structure. The active layer 134 may have well and barrier layers, using compound semiconductor materials of Ground III-V elements. For example, the active layer 134 may have a layer pair structure made of at least one of InGaN/GaN, InGaN/InGaN, GaN/AlGaN, InAlGaN/GaN, GaAs(InGaAs)/AlGaAs, or GaP(InGaP)/AlGaP, but the embodiment is not limited thereto. The well layer may be made of a material having a lower energy band gap than that of the barrier layer.

The second conductivity type semiconductor layer 136 may be disposed on the active layer 134. The second conductivity type semiconductor layer 136 may be made of a semiconductor compound. In particular, the second conductivity type semiconductor layer 136 may be made of a Group III-V or Group II-VI compound semiconductor, and may be doped with a second conductivity type dopant. The second conductivity type semiconductor layer 136 may be made of a semiconductor material having a formula of, for example, $In_xAl_yGa_{1-x-y}N$ ($0 \le x \le 1$, $0 \le y \le 1$, $0 \le x+y \le 1$). The second conductivity type semiconductor layer 136 may be made of at least one of AlInN, AlGaAs, GaP, GaAs, GaAsP, or AlGaInP. When the second conductivity type semiconductor layer 136 is a p-type semiconductor layer, the second conductivity type dopant is a p-type dopant such as Mg, Zn, Ca, Sr, or Ba. The second conductivity type semiconductor layer 136 may be formed to have a single layer structure or a multilayer structure, but the embodiment is not limited thereto.

FIG. 4 illustrates a plan view of the light emitting device 100A of the embodiment illustrated in FIGS. 1 and 2 under the condition that the lower structure including the elements 110 and the elements 182 to 194, a second insulating layer 154 and the first and second bonding layers 172 and 174 are removed from the light emitting device 100A.

The cross-sectional taken along line C-C' of FIG. 4 is the same as FIG. 2, and the cross-sectional taken along line D-D' of FIG. 4 is the same as FIG. 3.

The reflective layer 140 may be disposed on the second conductivity type semiconductor layer 136 of the light emitting structure 130. The reflective layer 140 may include first areas A11 and A12, and a second area A2, which are arranged in a horizontal direction in a neighboring manner. Here, the horizontal direction may be a z-axis direction perpendicular to a thickness direction of the light emitting structure 130, namely, an x-axis direction.

The reflective layer 140 may be a material having a property capable of reflecting light emitted from the light emitting structure 130. For example, the reflective layer 140 may be made of Ni, Al, Rh, Pd, Ir, Ru, Mg, Zn, Pt, Au, Hf or a selective combination thereof.

Referring to FIGS. 2 to 4, the first electrode 162 may be arranged with passing through the first areas A11 and A12 of the reflective layer 140, the second conductivity type semiconductor layer 136, and active layer 134 and with extending to the first conduction type semiconductor layer 132. That is, the first electrode 162 may be embedded in first blind holes, to be electrically connected to the first conductivity type semiconductor layer 132. Here, the first blind holes may mean holes extending to the first conduction type semiconductor layer 132 with passing through portions of the first areas A11 and A12 of the reflective layer 140, the second conductivity type semiconductor layer 136, and active layer 134, respectively.

The first electrode 162 may be made of a conductive material. For example, the first electrode 162 may be made of the conductive material such as Ag, Ni, Al, Rh, Pd, Ir, Ru, Mg, Zn, Pt, Au, Hf or a selective combination thereof.

The first electrode 162 may be a transparent conductive oxide (TCO) film. For example, the first electrode 162 may be made of at least one of the above-described materials, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but the embodiment is not limited thereto.

The first electrode 162 may include a material ohmic-contacting the first conductivity type semiconductor layer 132. The first electrode layer 162 may be formed to have a single layer structure or a multilayer structure, using a reflective electrode material having ohmic characteristics. When the first electrode layer 162 performs an ohmic function, no separate ohmic contact layer (not shown) may be formed. As shown in FIG. 2, the first electrode 162 includes a first contact portion 162-1 contacting the first conductivity type semiconductor layer 132, and a first extending portion 162-2 disposed on the second conductivity type semiconductor layer 136. FIG. 2 also illustrates a second electrode 142 includes a second contact portion 140 contacting the second conductivity type semiconductor layer 136, and a second extending portion 164 disposed on the second contact portion 140.

The insulating layer 150 may include a first insulating layer 152 and a second insulating layer 154.

The first insulating layer 152 may be interposed between a side surface of the light emitting structure 150 and the first electrode 162. That is, the first insulating layer 152 may be interposed between a side surface 162A of the first electrode 162 and a side surface of the second conductivity type semiconductor layer 136 and between the side surface 162A of the first electrode 162 and a side surface of the active layer 134. Also, as shown in FIG. 2, the first insulation layer 152 includes a lower portion 152L contacting the first conductivity type semiconductor layer 132, and an upper portion 152U disposed on the second contact portion 140. Accordingly, the first electrode 162 and the second conductivity type semiconductor layer 136 may be electrically insulated from each other, and the first electrode 162 may be electrically insulated from the active layer 134.

In addition, the first insulating layer 152 may be interposed between the side surface 162A of the first electrode 162 and the reflective layer 140. Accordingly, the first electrode 162 and the reflective layer 140 may be electrically insulated from each other.

The first insulating layer 152 may include at least one of $SiO_2$, $TiO_2$, SnO, ZnO, $Si_xO_y$, $Si_xN_y$, $SiO_xN_y$, ITO, or AZO.

Meanwhile, the diffusion barrier layer 164 may be disposed on the second area A2 of the reflective layer 140. That is, the diffusion barrier layer 164 may be locally interposed between the reflective layer 140 and the second bonding layer 174. As the diffusion barrier layer 164 may be interposed between the reflective layer 140 and the second bonding layer 174, it may be possible to prevent atoms of the material constituting the second bonding layer 174 from being diffused into at least one of the reflective layer 140 or light emitting structure 130.

In order to perform the above-described function, the diffusion barrier layer 164 may include at least one of Ni, Ti, Pt, or W. Meanwhile, the diffusion barrier layer 164 may include an ohmic contact material and, as such, no separate ohmic contact layer (not shown) may be disposed. Alternatively, a separate ohmic contact layer (not shown) may be formed over the diffusion barrier layer 164.

The diffusion barrier layer 164 may not only function to prevent diffusion of constitutive atoms of the second bonding layer 174, but also perform as a second electrode 142 for supplying second conductivity type carriers to the second conductivity type semiconductor layer 136. Although the diffusion barrier layer and the second electrode have been described as constituting a single layer structure designated by reference numeral "164", the second electrode may be formed to take a layer separate from the diffusion barrier layer.

Referring to FIGS. 2 and 3, the diffusion barrier layer 164 and the first insulating layer 152 may be disposed to be spaced apart from each other in a direction perpendicular to the thickness direction of the light emitting structure 130 above the reflective layer 140. Here, the thickness direction of the light emitting structure 130 may be the x-axis direction, and the direction perpendicular to the x-axis direction may be the z-axis direction. Accordingly, the diffusion barrier layer 164 and the first insulating layer 152 may be disposed to be spaced apart from each other in the z-axis direction by a distance between the boundary of the second area A2 and the boundary of the third area A3 above the reflective layer 140.

In addition, the diffusion barrier layer 164 and the first electrode 162 may be disposed to be spaced apart from each other in a direction perpendicular to the thickness direction of the light emitting structure 130 above the reflective layer 140. Here, the thickness direction of the light emitting structure 130 may be the x-axis direction, and the direction perpendicular to the x-axis direction may be the z-axis direction. Accordingly, the diffusion barrier layer 164 and the first electrode 162 may be disposed to be spaced apart from each other in the z-axis direction by a distance between the boundary of the fourth area A4 and the boundary of the second area A2.

When the constituent atoms of the second bonding layer 174 are diffused into the reflective layer 140, the reflectance of the reflective layer 140 may be lowered. On the other hand, when the constituent atoms of the second bonding layer 174 are diffused into the light emitting structure 130, the light emitting structure 130 exhibits increased resistance and, as such, the light emitting device 100A may exhibit degraded electrical characteristics and degraded light emission efficiency. To this end, the diffusion barrier layer 164 is arranged in accordance with the embodiment and, as such, it may be possible to avoid problems such as degradation of reflectance, degradation of electrical characteristics, and degradation of light emission efficiency.

FIG. 5 is a sectional view explaining characteristics of the light emitting device 100A illustrated in FIGS. 1 to 4.

Due to the thermal stress induced when the diffusion barrier layer 166 is thickly formed over the entire upper surface of the reflective layer 140, the diffusion barrier layer 166 may be bent upwards from the reflective layer 140 and, as such, may be peeled off, as illustrated in FIG. 5. The possibility that such peeling-off occurs may be very high because the diffusion barrier layer 166 is made of a material having high conductivity and high thermal expansion coefficient.

To this end, in the light emitting device 100A according to the embodiment, the diffusion barrier layer 164 may not be formed at the entirety of the first areas A11 and A12 and second area A2 of the reflective layer 140, but may be locally disposed only at the second area A2 of the reflective layer 140, as illustrated in FIGS. 2 and 3. In this case, the diffusion barrier layer 164 may not be peeled off from the reflective layer 140 because the diffusion barrier layer 164 is locally disposed only at the second area A2.

In addition, the thickness of the diffusion barrier layer 164 in the thickness direction of the light emitting structure 130 (for example, the x-axis direction), namely, a first thickness t1, may be greater than a second thickness t2 of the first electrode 162.

When the first thickness t1 of the diffusion barrier layer 164 in the thickness direction of the light emitting structure 130 is less than 50 nm, it may be difficult to prevent diffusion of the constituent atoms of the second bonding layer 174 because the first thickness t1 of the diffusion barrier layer 164 is too small. On the other hand, when the first thickness t1 of the diffusion barrier layer 164 is more than several μm, the total thickness of the light emitting device 100A may be increased because the because diffusion barrier layer 164 is too thick, even though the function of the diffusion barrier layer 164 is achieved. Accordingly, the first thickness t1 of the diffusion barrier layer 164 may be 50 nm to several μm, but the embodiment is not limited to the first thickness t1 ranged as described above.

Meanwhile, the diffusion barrier layer 164 and the first electrode 162 may be made of the same material or different materials. For example, the diffusion barrier layer 164 may be made of Ni, Ti, Pt, or W, and the first electrode 162 may be made of a material different from the above-described materials.

In addition, although the diffusion barrier layer 164 of the light emitting device 100A illustrated in FIG. 4 is illustrated as having a circular planar shape, the embodiment is not limited thereto. That is, although not shown, the diffusion barrier layer 164 may have an oval planar shape or a polygonal planar shape, in place of the circular planar shape, in accordance with another embodiment.

In addition, although the first insulating layer 152 surrounding the diffusion barrier layer 164 in the light emitting device 100A illustrated in FIG. 4 is illustrated as having a circular planar shape, the embodiment is not limited thereto. That is, although not shown, the first insulating layer 152 may surround the diffusion barrier layer 164 while having oval planar shape or a polygonal planar shape, in place of the circular planar shape, in accordance with another embodiment.

In addition, the planar shape of the diffusion barrier layer 164 and the planar shape of the first insulating layer 152 surrounding the diffusion barrier layer 164 in the light emitting device 100A illustrated in FIG. 4 are illustrated as being identical, the embodiment is not limited thereto. That is, the diffusion barrier layer 164 and the first insulating layer 152 may have different planar shapes in accordance with another embodiment.

Meanwhile, the second insulating layer 154 may be disposed above the first electrode 162 and the diffusion barrier layer 164. In addition, the second insulating layer 154 may be disposed at the upper portions of the first insulating layer 152 and reflective layer 140 exposed between the first electrode 162 and the diffusion barrier layer 164.

The second insulating layer 154 may include at least one of $SiO_2$, $TiO_2$, SnO, ZnO, $Si_xO_y$, $Si_xN_y$, $SiO_xN_y$, ITO, or AZO. As shown in FIG. 2, the second insulation layer 154 includes a first portion 154-1 contacting an upper surface 162US of the first extending portion 162-2, a second portion 154-2 contacting an upper surface 164US of the second extending portion 164, and a third portion 154-3 contacting an upper surface of the upper portion 152U of the first insulation layer 152. Also, the upper portion 152U of the first insulation layer 152 contacts a lower surface 162LS of the first extending portion 162-2 of the first electrode 162, and an upper surface of the second contact portion 140 of the second electrode 142. In addition, the upper portion 152U of the first insulation layer 152, the second contact portion 140 of the second electrode 142, and the first extending portion 162-2 of the first electrode 162 are overlapped with each other vertically, and the second portion 154-2 of the second insulation layer 154, the second extending portion 164 (diffusion barrier layer), and the second contact portion 140 are overlapped with each other vertically. Further, the third portion 154-3 of the second insulation layer 154 overlaps the second contact portion 140 vertically, and the third portion 154-3 of the second insulation layer 154 is not overlapped with the first electrode 162 and the second extending portion 164, vertically. Also, a width of the second contact portion 140 is greater than a width W1 of the second extending portion 164, a first height H1 between an upper surface of the second conductivity type semiconductor layer 136 and the upper surface 164US of the second extending portion 164 is greater than a second height H2 between the upper surface of the second conductivity type semiconductor layer and the upper surface of the first insulation layer 152, and a third height H3 between the upper surface of the second conductivity type semiconductor layer and the upper surface 162US of the first extending portion 162-2 is the same as the first height H1 between the upper surface of the second conductivity type semiconductor layer and the upper surface 164US of the second extending portion 164.

In addition, the first insulating layer 152 and second insulating layer 154 may be made of different materials or the same material, but the embodiment is not limited to the materials of the first and second insulating layers 152 and 154.

Meanwhile, the first bonding layer (pad) 172 may be electrically connected to the first electrode 162 with passing through the second insulating layer 154, and the second bonding layer (pad) 174 may be electrically connected to the second conductivity type semiconductor layer 136 via the diffusion barrier layer 164 with passing through the second insulating layer 154. In addition, as shown in FIG. 2, the first extending portion 162-2 of the first electrode 162 and the second extending portion 164 of the second electrode 142 are not overlapped with each other vertically, the first pad 172 contacts the first extending portion 162-2 of the first electrode 162, and the second pad 174 contacts the second extending portion 164 of the second electrode 142. Also, the first extending portion 162-2 of the first electrode 162 and the second extending portion 164 of the second electrode 142 are disposed on the second contact portion 140 of the second electrode 142, the first extending portion 162-2 of the first electrode and the second extending portion 142 of the second electrode are spaced apart from each other, and the first extending portion 162-2 of the first electrode further includes a side surface 162SS disposed between the upper surface 162US and the lower surface 162LS of the first extending portion 162-2. In addition, the second extending portion 164 of the second electrode further includes a lower surface 164LS opposite to the upper surface 164US of the second extending portion 164, and a side surface 164SS disposed between the upper surface 164US and the lower surface 164LS of the second extending portion 164, and the third portion 154-3 of the second insulation layer 154 is disposed between the side surface 162SS of the first extending portion 162-2 and the side surface 164SS of the second extending portion 164.

The above-described first electrode 162 may function to cause the first bonding layer 172 to supply first conductivity type carriers to the active layer 134. The diffusion barrier layer 164 may function to supply second conductivity type carriers to the active layer 134.

When the first conductivity type carriers are electrons, and the second conductivity type carriers are holes, the first electrode 162 may correspond to a cathode of the light emitting device 100A, and the diffusion barrier layer 164 may correspond to an anode of the light emitting device 100A.

Conversely, when the first conductivity type carriers may bee holes, and the second conductivity type carriers may be electrons. In this case, the diffusion barrier layer 164 may function as the second electrode. Accordingly, the first conductivity type carriers supplied from the first electrode 162 and the second conductivity type carries supplied from the diffusion barrier layer 164 may be re-combined in the active layer 134 and, as such, light may be emitted.

In addition, in order to achieve the above-described function of the diffusion barrier layer 164, namely, to prevent the constituent atoms of the second bonding layer 174 from being diffused into at least one of the reflective layer 140 or light emitting structure 130, the width of a portion of the diffusion barrier layer 164 contacting the reflective layer 140 at the second area A2, namely, a first width W1, may be equal to or greater than the width of a portion of the second bonding layer 174 passing through the second insulating layer 154, namely, a second width W2.

FIG. 6 illustrates a plan view of a light emitting device 100B according to another embodiment corresponding to the embodiment in which the lower structure including the elements 110 and the elements 182 to 194, and the first and second bonding layers 172 and 174 are removed from the light emitting device 100A illustrated in FIGS. 1 and 2.

In the case of the light emitting device 100B illustrated in FIG. 6, the first electrode is divided into a 1-1-th electrode 162-1 and a 1-2-th electrode 162-2, differently than the light emitting device 100A of the embodiment illustrated in FIG. 4. The 1-1-th electrode 162-1 and the 1-2-th electrode 162-2 may be electrically insulated from each other by the first insulating layer 152. Except for the above-described differences, the light emitting device 100B in FIG. 6 is identical to the light emitting device illustrated in FIG. 4, and, as such, no repeated description will be given.

Although the first and second bonding layers 172 and 174 in the light emitting device 100A illustrated in FIG. 1 is illustrated as having a rectangular planar shape, the embodiment is not limited thereto. That is, although not shown, each of the first and second bonding layers 172 and 174 may have a polygonal planar shape, a circular planar shape or an oval planar shape, in place of the rectangular planar shape, in accordance with another embodiment.

Hereinafter, the lower structure including the element 110 and the elements 182 to 194 will be described with reference to FIGS. 2 and 3.

The first and second metal pads 192 and 194 may be disposed on the sub-mount 110 while being spaced apart from each other in a horizontal direction (for example, the z-axis direction).

The sub-mount 110 may be constituted by a semiconductor substrate made of AlN, BN, silicon carbide (SiC), GaN, GaAs, Si, or the like, but the embodiment is not limited thereto. For example, the sub-mount 110 may be made of a semiconductor material having thermal characteristics.

When the sub-mount 110 is made of Si, a passivation layer (not shown) may further be interposed between the first and second electrode pads 192 and 194 and the sub-mount 110. In this case, the passivation layer may be made of an insulating material.

In addition, the first and second conductivity type semiconductor layers 132 and 136 of the light emitting structure 130 may be electrically connected to the first and second metal pads 192 and 194 via the first and second bumps 182 and 184, respectively.

The first bump 182 may be interposed between the first bonding layer 172 and the first metal pad 192. Accordingly, the first metal pad 192 may be electrically connected to the first conductivity type semiconductor layer 132 via the first bump 182, first bonding layer 172 and first electrode 162.

Similarly, the second bump 182 may be interposed between the second bonding layer 174 and the second metal pad 194. Accordingly, the second metal pad 194 may be electrically connected to the second conductivity type semiconductor layer 136 via the second bump 184, second bonding layer 174 and diffusion barrier layer 164.

Although not shown, a first upper bump metal layer (not shown) may further be interposed between the first bonding layer 172 and the first bump 182, and a first lower bump metal layer (not shown) may further be interposed between the first electrode pad 192 and the first bump 182. In this case, the first upper bump metal layer and the first lower bump metal layer function to indicate a location where the first bump 182 will be positioned. Similarly, a second upper bump metal layer (not shown) may further be interposed between the second bonding layer 174 and the second bump 184, and a second lower bump metal layer (not shown) may further be interposed between the second electrode pad 194 and the second bump 184. In this case, the second upper bump metal layer and the second lower bump metal layer function to indicate a location where the second bump 184 will be positioned.

If necessary, the first and second bumps 182 and 184 may be dispensed with when the first and second bonding layers 172 and 174 perform the functions of the first and second bumps 182 and 184, respectively.

Hereinafter, a method for manufacturing the light emitting device 100A illustrated in FIGS. 1 and 2 will be described with reference to the accompanying drawings, but the embodiment is not limited thereto. That is, the light emitting device 100A may be manufactured using another method.

FIGS. 7a to 7h are sectional views explaining respective processes of a method for manufacturing the upper structure including the elements 120 to 174 in the light emitting device 100A illustrated in FIG. 2.

As illustrated in FIG. 7a, the substrate 120 is prepared. For example, the substrate 120 may be made of at least one of sapphire ($Al_2O_3$), SiC, GaAs, GaN, ZnO, Si, GaP, InP, or Ge, but the embodiment is not limited thereto.

Thereafter, as illustrated in FIG. 7b, the light emitting structure 130 may be formed through sequential growth of the first conductivity type semiconductor layer 132, active layer 134 and second conductivity type semiconductor layer 136 over the substrate 120. The light emitting structure 130 may be formed using, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like, but the embodiment is not limited thereto.

Subsequently, the reflective layer 140 is formed over the light emitting structure 130. The reflective layer 140 may be made of Ni, Al, Rh, Pd, Ir, Ru, Mg, Zn, Pt, Au, Hf or a selective combination thereof.

Thereafter, as illustrated in FIG. 7c, first blind holes OP1 are formed at portions of the first and second areas A11 and A12 of the reflective layer 140, respectively, such that the first blind holes OP1 extend to the first conductivity type semiconductor 132 with passing through the second conductivity type semiconductor layer 136 and active layer 134.

Subsequently, as illustrated in FIG. 7d, the first insulating layer 152 is formed at side surfaces of the first blind holes OP1. In this case, portions of the first conductivity type semiconductor layer 132 disposed beneath the first blind holes OP1 are exposed. Also, as shown in FIG. 7d, the upper portion 152U of the first insulation layer includes a first opened region 1520P on the second conductivity type semiconductor layer. Also, the second extending portion 164 is disposed in the first opened region 1520P, and the second extending portion 164 contacts the second contact portion 140.

As illustrated in FIG. 7e, a mask pattern M is then formed over the exposed reflective layer 140. In this case, the mask pattern M may open a region where the diffusion barrier layer 164 will be formed and a region where the first electrode 162 will be formed.

Thereafter, as illustrated in FIG. 7f, the diffusion barrier layer 164 and the first electrode 162 are formed using the mask pattern M in accordance with a general photolithography process. The mask pattern M is then removed.

FIGS. 7e and 7f are sectional views illustrating processes used in the case in which the diffusion barrier layer 164 and the first electrode 162 are formed using the same material. However, the processes illustrated in FIGS. 7E and 7F may be varied in order to form the diffusion barrier layer 164 and the first electrode 162 using different materials. That is, the diffusion barrier layer 164 may first be formed, and the first electrode 162 may then be formed in accordance with a general photolithography process. Alternatively, the first electrode 162 may first be formed, and the diffusion barrier layer 164 may then be formed.

Subsequently, as illustrated in FIG. 7g, the second insulating layer 154 is formed over the resultant structure illustrated in FIG. 7f. That is, the second insulating layer 154 is formed entirely over the first electrode 162, the diffusion barrier layer 164 and the exposed portion of the reflective layer 140, and the exposed upper surface of the first insulating layer 152. The second insulating layer 154 is then etched in accordance with a general photolithography process and, as such, second blind holes OP2 are formed. Also, the second insulation layer 154 includes a second opened area OP2, the first pad 172 contacts the first extending portion 162-2 via the second opened area OP2 of the second insulation layer, and the second pad 174 contacts the second extending portion 164 via the second opened area OP2 of the second insulation layer.

As illustrated in FIG. 7h, the second blind holes OP2 are then plugged, thereby forming the first and second bonding layers 172 and 174. In addition, the resultant structure illustrated in FIG. 7h may be subjected to a lapping process and a polishing process. FIG. 7h also illustrates the first extending portion 162-2.

Figure 8A:
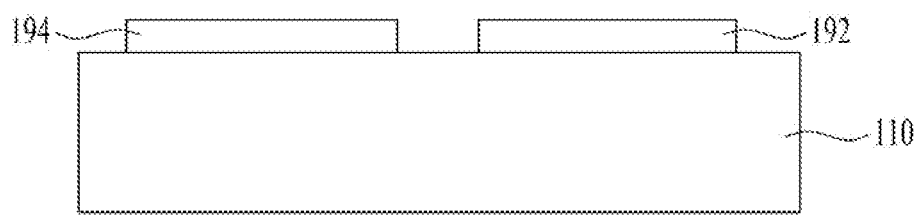

FIGS. 8a and 8b are sectional views explaining processes of a method for manufacturing the lower structure including the element 110 and the elements 182 to 194 in the light emitting device 100A illustrated in FIG. 2.

The processes for manufacturing the lower structure including the element 110 and the elements 182 to 194 may be carried out simultaneously with the processes illustrated in FIGS. 7a to 7h.

As illustrated in FIG. 8a, the first and second metal pads 192 and 194 are formed on the sub-mount 110. The sub-mount 110 may be constituted by a semiconductor substrate made of AlN, BN, silicon carbide (SiC), GaN, GaAs, Si, or the like, but the embodiment is not limited thereto. For example, the sub-mount 110 may be made of a semiconductor material having thermal characteristics.

The first and second metal pads 192 and 194 may be formed on the sub-mount 110 while being spaced apart from each other in a horizontal direction.

When the sub-mount 110 is made of Si, a passivation layer (not shown) may further be formed over the sub-mount 110 before formation of the first and second metal pads 192 and 194. In this case, the first and second metal pads 192 and 194 are formed on the passivation layer after formation of the passivation layer.

Thereafter, as illustrated in FIG. 8b, the first and second bumps 182 and 184 are formed on the first and second metal pads 192 and 194, respectively.

Subsequently, the upper structure illustrated in FIG. 7h is disposed on the lower structure illustrated in FIG. 8b and, as such, the light emitting device 100A illustrated in FIG. 2 is completed. That is, the resultant structure illustrated in FIG. 7h is rotated such that the substrate 120 is directed upwards, and is then coupled to the resultant structure illustrated in FIG. 8b. At this time, as illustrated in FIG. 2, the first bonding layer 172 and the first metal pad 192 may be coupled to the first bump 182, and the second bonding layer 174 and the second electrode pad 194 may be coupled by the second bump 182.

Hereinafter, the configuration and operation of a light emitting device package including the light emitting device 100A illustrated in FIG. 2 will be describe.

FIG. 9 illustrates a sectional view of a light emitting device package 200A according to an embodiment.

The light emitting device package 200A in FIG. 9 may include a light emitting device 100A, a header 210, a pair of leads 222 and 224, a bond 230, a molding member 240, first and second wires 252 and 254, and a side wall 260.

The light emitting device 100A is the light emitting device illustrated in FIGS. 1 and 2 and, as such, no detailed description thereof will be given under the condition that the same reference numerals are used. Of course, the light emitting device 100B in FIG. 6 may be implemented in the case of FIG. 9, in place of the light emitting device 100A.

The sub-mount 110 may be connected to the header 210 by the bond 230. The bond 230 may take the form of a solder or a paste. The first and second metal pads 192 and 194 of the light emitting device 100A may be connected to the leads 222 and 224 by the first and second wires 252 and 254, respectively. Electric power is supplied to the light emitting device 100A via the leads 222 and 224, which are electrically isolated from each other.

The molding member 240 may fill a cavity formed by the side wall 260 and, as such, surrounds the light emitting device 100A, thereby protecting the light emitting device 100A. In addition, the molding member 240 may contain a fluorescent substance and, as such, may vary the wavelength of light emitted from the light emitting device 100A.

Such light emitting device packages according to the embodiment may be arrayed on a substrate. Optical members, namely, light guide plates, prism sheets, diffusion sheets, etc., may be arranged on optical paths of the light emitting device packages. Such light emitting device packages, substrate and optical members may function as a backlight unit.

In addition, a display apparatus, an indicating apparatus or a lighting apparatus may be implemented including the light emitting device package according to the embodiment.

In this case, the display apparatus may include a bottom cover, a reflective plate arranged on the bottom cover, a light emitting module for emitting light, a light guide plate arranged in front of the reflective plate, to guide light emitted from the light emitting module in a forward direction, an optical sheet arranged in front of the light guide plate while including prism sheets, a display pane arranged in front of the optical sheet, an image signal output circuit connected to the display panel, to supply an image signal to the display panel, and a color filter arranged in front of the display panel. In this case, the bottom cover, reflective plate, light emitting module, light guide plate and optical sheet may constitute a backlight unit.

Meanwhile, the lighting apparatus may include a light source module including a substrate and the light emitting device package according to the embodiment, a radiator for dissipating heat from the light source module, and a power supplier for processing or converting an electrical signal received from outside, and supplying the resultant signal to the light source module. For example, the lighting apparatus may include a lamp, a headlamp, or a street lamp.

The head lamp may include a light emitting module including light emitting device packages arranged on a substrate, a reflector for reflecting light emitted from the light emitting module in a certain direction, for example, a forward direction, a lens for refracting light reflected by the reflector in a forward direction, and a shade for partially blocking or reflecting light directed to the lens after being reflected by the reflector, to obtain a backlight pattern desired by the designer.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

Various embodiments have been described in the best mode for carrying out the invention.

The light emitting device and light emitting device package according to the embodiments are applicable to a display apparatus, an indicating apparatus, a lighting apparatus or the like.

What is claimed is:

1. A light emitting device comprising:
   a substrate;
   a light emitting structure disposed on the substrate;
   a first insulation layer disposed on the light emitting structure;
   a second insulation layer disposed on the first insulation layer;
   a first electrode and a second electrode electrically connected to the light emitting structure;
   a first pad electrically connected to the first electrode; and
   a second pad electrically connected to the second electrode,
   wherein the light emitting structure includes a first conductivity type semiconductor layer, an active layer disposed on the first conductivity type semiconductor layer, and a second conductivity type semiconductor layer disposed on the active layer,
   wherein the first electrode includes a first contact portion contacting the first conductivity type semiconductor layer, and a first extending portion disposed on the second conductivity type semiconductor layer,
   wherein the second electrode includes a second contact portion contacting the second conductivity type semiconductor layer, and a second extending portion disposed on the second contact portion,
   wherein the first insulation layer includes a lower portion contacting the first conductivity type semiconductor layer, and an upper portion disposed on the second contact portion,
   wherein the second insulation layer includes a first portion contacting an upper surface of the first extending portion, a second portion contacting an upper surface of the second extending portion, and a third portion contacting an upper surface of the upper portion of the first insulation layer,
   wherein the upper portion of the first insulation layer contacts a lower surface of the first extending portion of the first electrode, and an upper surface of the second contact portion of the second electrode,
   wherein the upper portion of the first insulation layer, the second contact portion of the second electrode, and the first extending portion of the first electrode are overlapped with each other vertically,
   wherein the second portion of the second insulation layer, the second extending portion, and the second contact portion are overlapped with each other vertically,
   wherein the third portion of the second insulation layer overlaps the second contact portion vertically,
   wherein the third portion of the second insulation layer is not overlapped with the first electrode and the second extending portion, vertically,
   wherein the first extending portion of the first electrode and the second extending portion of the second electrode are not overlapped with each other vertically,
   wherein the first pad contacts the first extending portion of the first electrode, and
   wherein the second pad contacts the second extending portion of the second electrode.

2. The light emitting device of claim 1, wherein the first extending portion of the first electrode and the second extending portion of the second electrode are disposed on the second contact portion of the second electrode, and
   wherein the first extending portion of the first electrode and the second extending portion of the second electrode are spaced apart from each other.

3. The light emitting device of claim 2, wherein the first extending portion of the first electrode further includes a side surface disposed between the upper surface and the lower surface of the first extending portion,
   wherein the second extending portion of the second electrode further includes a lower surface opposite to the upper surface of the second extending portion, and a side surface disposed between the upper surface and the lower surface of the second extending portion, and
   wherein the third portion of the second insulation layer is disposed between the side surface of the first extending portion and the side surface of the second extending portion.

4. The light emitting device of claim 3, wherein the side surface of the first extending portion and the side surface of the second extending portion face each other and are spaced apart from each other on the second contact portion of the second electrode.

5. The light emitting device of claim 4, wherein the third portion of the second insulation layer is not overlapped with the first pad, vertically.

6. The light emitting device of claim 1, wherein the first insulation layer includes a first material,
   wherein the second insulation layer includes a second material, and
   wherein the first material is different from the second material.

7. The light emitting device of claim 6, wherein the first material includes silicon oxide, and
   wherein the second material includes silicon nitride.

8. The light emitting device of claim 7, wherein a width of the second contact portion is greater than a width of the second extending portion.

9. The light emitting device of claim 3, wherein a first height between an upper surface of the second conductivity type semiconductor layer and the upper surface of the second extending portion is greater than a second height between the upper surface of the second conductivity type semiconductor layer and the upper surface of the first insulation layer.

10. The light emitting device of claim 9, wherein a third height between the upper surface of the second conductivity type semiconductor layer and the upper surface of the first extending portion is the same as the first height between the upper surface of the second conductivity type semiconductor layer and the upper surface of the second extending portion.

11. The light emitting device of claim 1, wherein the upper portion of the first insulation layer includes a first opened region on the second conductivity type semiconductor layer,
    wherein the second extending portion is disposed in the first opened region, and
    wherein the second extending portion contacts the second contact portion.

12. The light emitting device of claim 11, wherein the second insulation layer includes a second opened area,
    wherein the first pad contacts the first extending portion via the second opened area of the second insulation layer, and
    wherein the second pad contacts the second extending portion via the second opened area of the second insulation layer.

13. The light emitting device of claim 12, wherein a portion of the first pad contacts the second insulation layer.

14. The light emitting device of claim 1, wherein the second pad includes a lower surface contacting the second extending portion, and
    wherein a width of the second extending portion is greater than a width of the lower surface of the second pad.

15. A light emitting device comprising:
    a substrate;
    a light emitting structure disposed on the substrate;
    a first insulation layer disposed on the light emitting structure;
    a second insulation layer disposed on the first insulation layer;
    a first electrode and a second electrode electrically connected to the light emitting structure;
    a first pad electrically connected to the first electrode; and
    a second pad electrically connected to the second electrode,
    wherein the light emitting structure includes a first conductivity type semiconductor layer, an active layer disposed on the first conductivity type semiconductor layer, a second conductivity type semiconductor layer disposed on the active layer,
    wherein the first electrode includes a first contact portion contacting the first conductivity type semiconductor layer, and a first extending portion disposed on the second conductivity type semiconductor layer,
    wherein the second electrode includes a second contact portion contacting the second conductivity type semiconductor layer, and a second extending portion disposed on the second contact portion,
    wherein the first insulation layer includes a lower portion contacting the first conductivity type semiconductor layer, and an upper portion disposed on the second contact portion,
    wherein the upper portion of the first insulation layer contacts a lower surface of the first extending portion of the first electrode, and an upper surface of the second contact portion of the second electrode, and
    wherein the upper portion of the first insulation layer, the second contact portion of the second electrode, and the first extending portion of the first electrode are overlapped with each other vertically,
    wherein the first extending portion of the first electrode and the second extending portion of the second electrode are not overlapped with each other vertically on the second contact portion of the second electrode,
    wherein the second insulation layer includes a first portion contacting an upper surface of the first extending portion, a second portion contacting an upper surface of the second extending portion, a third portion contacting an upper surface of the first insulation layer,
    wherein the first portion, the second portion, and the third portion of the second insulation layer are overlapped with the second contact portion vertically,
    wherein the third portion of the second insulation layer is disposed between the first extending portion and the second extending portion,
    wherein the third portion of the second insulation layer is not overlapped with the first electrode and the second extending portion, vertically,
    wherein the first pad contacts the first extending portion of the first electrode, and
    wherein the second pad contacts the second extending portion of the second electrode.

* * * * *